(12) United States Patent
Chiu et al.

(10) Patent No.: US 7,701,258 B2
(45) Date of Patent: Apr. 20, 2010

(54) LATCH

(75) Inventors: Wei-Ming Chiu, Hsinchu (TW); Ka-Un Chan, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 101 days.

(21) Appl. No.: 12/000,063

(22) Filed: Dec. 7, 2007

(65) Prior Publication Data
US 2008/0136482 A1   Jun. 12, 2008

(30) Foreign Application Priority Data
Dec. 12, 2006   (TW) .............................. 95146376 A

(51) Int. Cl.
*G11C 7/00*   (2006.01)
(52) U.S. Cl. .......................... 327/57; 327/215; 327/218
(58) Field of Classification Search .................. 327/57, 327/218, 215, 212, 211
See application file for complete search history.

(56) References Cited

U.S. PATENT DOCUMENTS

| | | | | |
|---|---|---|---|---|
| 5,510,734 A * | 4/1996 | Sone | ............................. | 327/65 |
| 5,625,308 A * | 4/1997 | Matsumoto et al. | ......... | 327/203 |
| 6,525,571 B2 * | 2/2003 | Green | ......................... | 326/115 |
| 6,683,479 B2 * | 1/2004 | Engl | ............................. | 327/52 |
| 6,774,721 B1 * | 8/2004 | Popescu et al. | ............. | 330/253 |
| 6,861,888 B2 * | 3/2005 | Hsieh | ......................... | 327/208 |
| 6,943,720 B2 * | 9/2005 | Nakamori et al. | ........... | 341/156 |
| 7,304,518 B2 * | 12/2007 | Sanduleanu et al. | ......... | 327/185 |
| 2003/0132791 A1 * | 7/2003 | Hsieh | ......................... | 327/218 |
| 2003/0193370 A1 * | 10/2003 | Leifso et al. | ................. | 330/254 |

FOREIGN PATENT DOCUMENTS

TW   200507455   5/1993

* cited by examiner

*Primary Examiner*—Lincoln Donovan
*Assistant Examiner*—Ryan C Jager
(74) *Attorney, Agent, or Firm*—Muncy, Geissler, Olds & Lowe

(57) ABSTRACT

A latch includes: an amplifying circuit, for receiving a first bias current in a first state for amplifying an input signal to generate an amplified signal; a latching unit, for latching the amplified signal and receiving a second bias current in a second state to output the amplified signal; and a biasing circuit, for providing a biasing current to the amplifying circuit, and providing the second biasing current to the latching unit. The biasing circuit includes: a first biasing module for providing a third biasing circuit to the amplifying circuit in the first state; and a second biasing module, for providing a fourth biasing current to the amplified circuit; wherein the first biasing circuit is equal to a sum of the third biasing current and the fourth biasing current.

23 Claims, 6 Drawing Sheets

LATCH

BACKGROUND OF THE INVENTION

1. Field of the Invention

The present invention relates to a latch, and more particularly, to a latch capable of being operated in a high frequency.

2. Description of the Related Art

In an integrated circuit, clock signals having different frequencies are often utilized to perform different operations. As is known, the phase locked loop (PLL)/synthesizer is widely used for generating the above-mentioned clock signals having different frequencies.

As known by those skilled in the art, the PLL/synthesizer comprises a frequency divider, which is utilized to divide the frequency generated by the inner VCO (voltage controlled oscillator). Through the above-mentioned mechanism, the PLL can output a clock signal having a wanted frequency.

In general, the frequency divider is often implemented by D-type flip-flops. Please refer to FIG. 1, which is a diagram of a frequency divider 100 having a divisor 2 according to the prior art. As shown in FIG. 1, the frequency divider 100 is implemented by a D-type flip-flop 200. The input end Q' and the input end D of the D-type flip-flop 200 are coupled to each other. In this way, as shown in FIG. 1, the frequency of the output signal outputted from the output end Q' is twice of that of the clock signal CK inputted into the clock input end. Since the operation and function of the D-type flip-flop are well known, and thus omitted here.

In addition, the frequency divider is often operated in a high frequency. Therefore, in the actual implementation, the D-type flip-flop is often implemented by a current mode logic (CML) circuit, which comprises two latches. Please note, the related theory and the conventional circuit structure can be referred to the page 290 of RF Microelectronics (ISBN: 0-13-887571-5) written by Behzad Razavi, and further illustration is omitted here.

However, if the function of the above-mentioned frequency divider 100 should be achieved, the input end and the output end of the above-mentioned D-type flip-flop are coupled together such that the feedback loop (it is equivalent to the feedback loop from the output end Q to the input end D shown in FIG. 1) is established. As mentioned previously, the CML D-type flip-flop is more appropriate for the high-frequency operation, but it still has many restrictions.

For example, if the circuit designer wants to design a frequency divider having a devisor 4, the most frequently-used method is to connect two frequency divider having a devisor 2 (that is, to connect two D-type flip-flops).

But, if the frequency divider having the devisor 4 should be operated in a high frequency, a conventional solution is to reduce the inner load (it could be a resistor or passive device) of the D-type flip-flops such that the RC constant is also reduced. However, a larger biasing current is needed such that enough signal amplitude is provided to the following D-type flip-flop.

Please note, the operation of raising the biasing current often encounters following problems:

The first solution is to raise the biasing current without adjusting the W/L ratio of inner transistors. But this reduces the voltage difference $V_{DS}$ of the biasing current source (such as a current mirror), and may further make the biasing current source be in the triode region such that the current cannot be increased more, and the operational frequency cannot be raised, either.

The second solution is to raise the biasing current with adjusting the W/L ratio of inner transistors. However, this makes the parasitic capacitor of the gate of the inner transistors larger. Unfortunately, the increasing parasitic capacitor becomes the load of the previous D-type flip-flop such that the RC delay of the previous D-type flip-flop increases accordingly. This also limits the operational frequency of the entire circuit.

SUMMARY OF THE INVENTION

In view of the above-mentioned problems, an object of the invention is to provide a latch capable of being operated in a high frequency, to further solve the above-mentioned problems.

According to an embodiment of the present invention, a latch is disclosed. The latch comprises: an amplifying circuit, for receiving a first biasing current in a first state to amplify an input signal to generate an amplified signal; a latching unit, coupled to the amplifying circuit, for latching the amplified signal and for receiving a second biasing current in a second state to output the amplified signal; and a biasing circuit, coupled to the amplifying circuit and the latching unit, for providing the first biasing current to the amplified circuit in the first state and for providing the second biasing current to the latching unit, the biasing circuit comprising: a first biasing module, coupled to the amplifying circuit, for providing a third biasing current to the amplifying circuit in the first state; and a second biasing module, coupled to the amplified circuit, for providing a fourth biasing current to the amplifying circuit; wherein the first biasing current is equal to a sum of the third biasing current and the fourth biasing current.

According to another embodiment of the present invention, a latch is disclosed. The latch comprises: an input circuit, for receiving an input signal and generating an output signal according to the input signal and an input reference current; an output circuit, coupled to the input circuit, for receiving the output signal and outputting the output signal according to an output reference current; and a current generating circuit, coupled to the input circuit and the output circuit, for generating the output reference current to the input circuit according to a clock signal, and for generating the output reference current to the output circuit, the current generating circuit comprising: a first current generating unit, for providing a first current to the input circuit when the clock signal corresponds to a first logic level, wherein the first current is a part of the input reference current; and a second current generating unit, for providing a second current to the input circuit when the clock signal corresponds to the first logic level, and for providing the second current to the output circuit when the clock signal corresponds to a second logic level, wherein the second current is a part of the input reference current, and the second current is equal to the output reference current or is a part of the output reference current.

The present invention does not need to adjust the W/L ratio of the inner transistors or to increase $V_{GS}$ of the inner transistors in order to increase the biasing current. Therefore, the present invention latch can prevent from the parasitic capacitor problem and can be operated in a high frequency.

DETAILED DESCRIPTION OF THE INVENTION

The "TITLE" of the invention will be described with reference to the accompanying drawings.

Figures 1, 2:
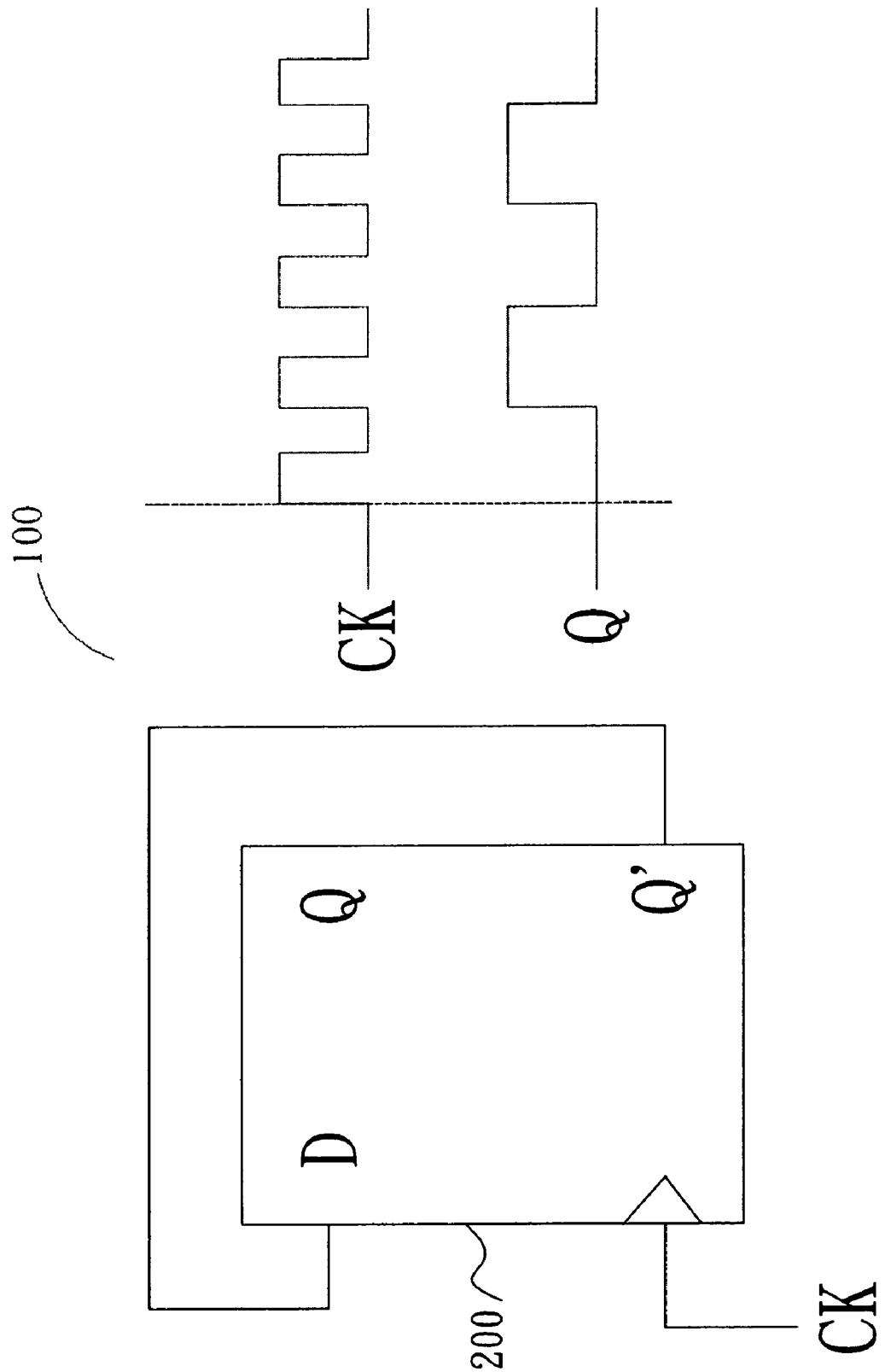
FIG. 1 is a diagram of a frequency divider having a divisor 2 according to the prior art.
FIG. 2 is a diagram of a latch of a first embodiment according to the present invention.
Figure 2:
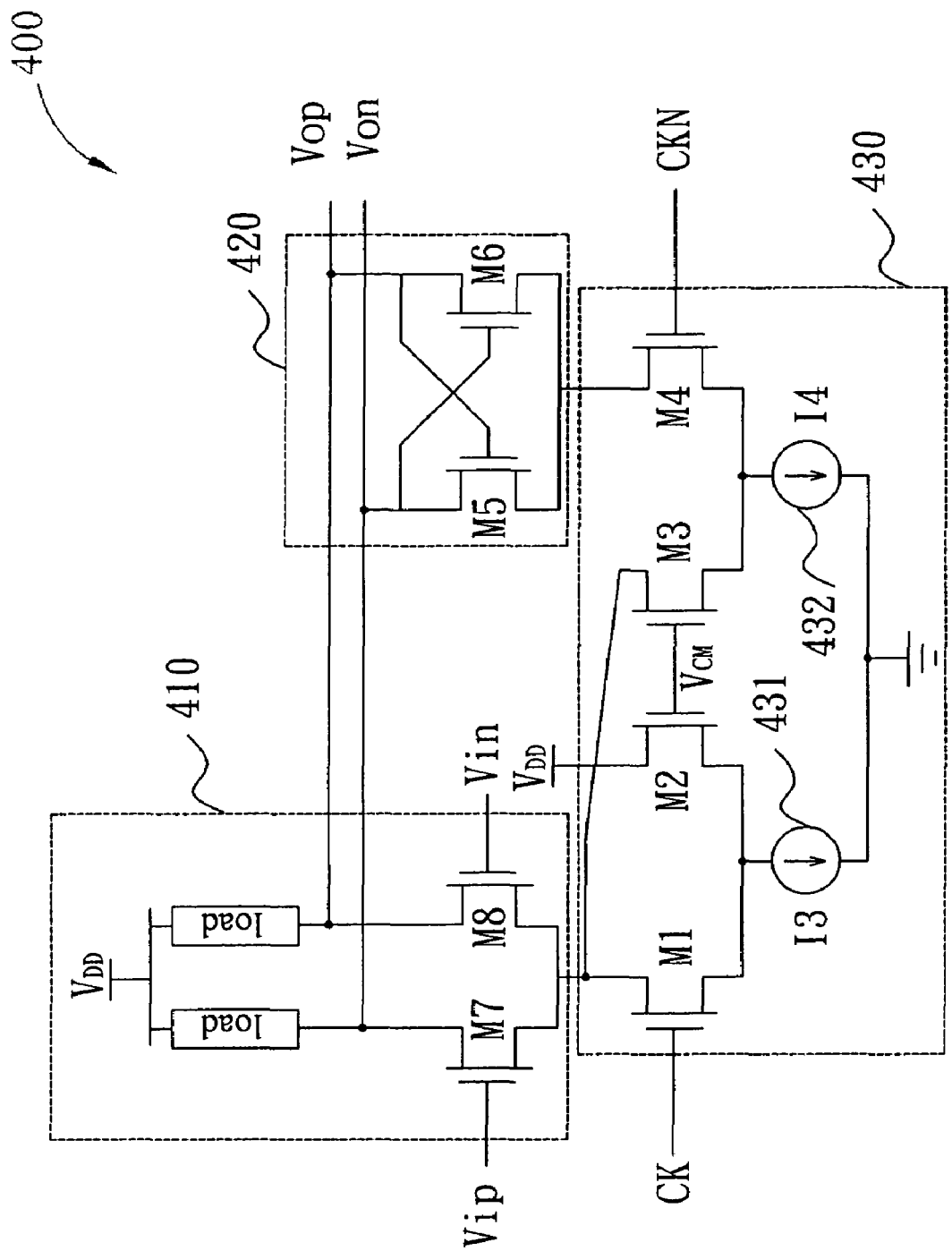

Please refer to FIG. 2, which is a diagram of a latch 400 of a first embodiment according to the present invention. As shown in FIG. 2, the latch 200 comprises a preamplifier 410, a latching unit 420, and a biasing circuit 430.

The latching unit 420 comprises two cross-coupled transistors M5 and M6. Because the gate of the transistor M5 is coupled to the drain of the transistor M6 and the gate of transistor M6 is coupled to the drain of the transistor M5 (cross-coupling structure), the signals Von and Vop can be utilized to control the conducting conditions of the transistors M5 and M6 such that the voltage level of the signals Von and Vop can be maintained.

Figure 3:
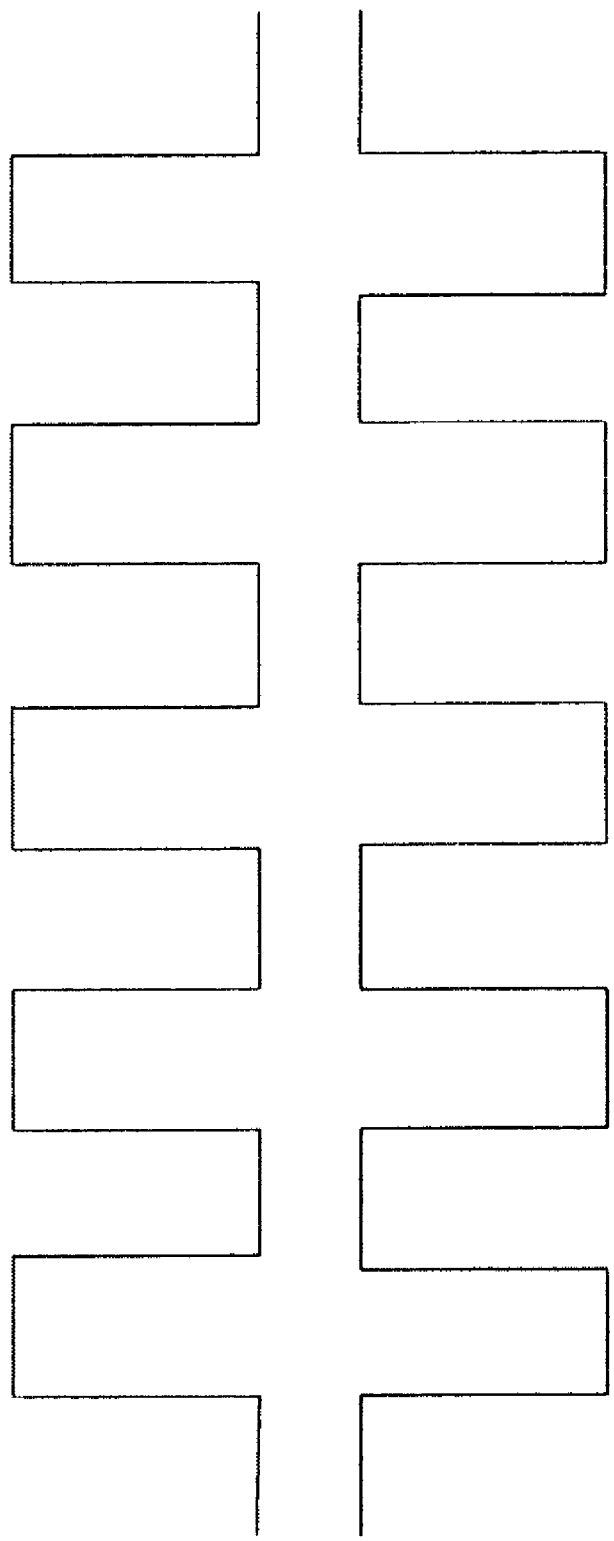
FIG. 3 is a diagram showing the control clock CK and the inversed control clock CKN.

Please note, the biasing circuit 430 in the latch 400 is different from the conventional biasing circuit. In this embodiment, the biasing circuit 430 comprises four transistors M1~M4. In addition, the gates of the transistors M2 and M3 are coupled to a common mode voltage level $V_{CM}$, the gates of the transistors M1 and M4 are respectively coupled to the control clock CK and inversed control clock CKN. Here, please refer to FIG. 3, which is a diagram showing the control clock CK and the inversed control clock CKN.

Furthermore, the transistors M1 and M2 can be regarded as a differential circuit (or can be regarded as a sub-biasing module), where the sources of the transistors M1 and M2 are both coupled to a biasing current source 430, the drain of the transistor M1 is coupled to the preamplifier 410, and the drain of the transistor M2 is coupled to the external voltage source $V_{DD}$.

On the other hand, the transistors M3 and M4 can be regarded as another differential circuit (or can be regarded as another sub-biasing module), where the sources of the transistors M1 and M2 are both coupled to a biasing current source 432, the drain of the transistor M3 is coupled to the preamplifier 410, and the drain of the transistor M4 is coupled to the latching unit 420.

In addition, in order to make the entire circuit work correctly, the voltage levels of the control clock CK, the inversed control clock CKN, and the common mode voltage level $V_{CM}$ should be appropriately set. In this embodiment, when the control clock CK corresponds to a high logic level (e.g: rising edge), the voltage level of the control clock CK is higher than the common mode voltage level $V_{CM}$. Furthermore, the control clock CK corresponds to a low logic level (e.g: falling edge), the voltage level of the control clock CK is lower than the common mode voltage level $V_{CM}$.

For example, the high logic level of the control clock CK can be set as a voltage level 3.5V, the common mode voltage level $V_{CM}$ can be set as 0V, and the high logic level of the control clock CK can be set as a voltage level −3.5V. However, the above-mentioned voltage levels 3.5V, 0V, and −3.5V are only utilized as an embodiment, not a limitation of the present invention.

In the following disclosure, the operations of the latch 400 will be illustrated.

First of all, when the control clock CK corresponds to a high logic level (such as at rising edge), for the differential circuit composed of two transistors M1 and M2, almost all of the current I3 provided by the biasing current source 431 is transferred to the preamplifier 410 via the transistor M1 because the control clock CK is much higher than the common mode voltage level $V_{CM}$.

On the other hand, for the differential circuit composed of two transistors M3 and M4, almost all of the current I4 provided by the biasing current source 432 is transferred to the preamplifier 410 via the transistor M3 because the common mode voltage level $V_{CM}$ is much higher than the inversed control clock CKN.

In this embodiment, the preamplifier 410 comprises a transistor pair M7 and M8 and two corresponding loads. After the current I3+I4 is inputted into the transistor pair M7 and M8, the transistor pair M7 and M8 starts to operate with the loads such that the preamplifier 410 performs an amplifying operation on the input signals Vin and Vip and then outputs the amplified signals to the latching unit 420.

And then, when the control clock CK corresponds to a low logic level (e.g: falling edge), for the differential circuit composed of two transistors M3 and M4, almost all of the current I4 provided by the biasing current source 432 is transferred to the latching unit 420 via the transistor M4 because the common mode voltage level $V_{CM}$ is much higher than the inversed control clock CKN. Therefore, the latching unit 420 operates to latch the signals transferred from the preamplifier 410 and then outputs the latched signals.

From the above disclosure, it can be seen that the total biasing current inputted into the preamplifier 410 is the sum of the two biasing currents I3+I4. In other words, if the currents I3 and I4 are the same (for example, they are both equal to the current I), the present invention biasing circuit 430 can provide the current 2I to the preamplifier 410. In this way, the current can be double (it can have an equivalent effect of increasing the W/L ratio of the transistor). Furthermore, because the gate of the transistor M2 is coupled to the common mode voltage level $V_{CM}$ such that it does not influence the parasitic capacitor of the transistor M1. This means that the parasitic capacitor of the transistor M1 does not become larger. In other words, the load of the previous stage in not increased and the operational frequency of the latch 400 is not limited.

In other words, if the latch 400 needs to work in a high frequency and an additional biasing current is needed, the present invention can utilize the biasing current I4 as the additional biasing current (where the biasing current I3 can be the same). In this way, the W/L ratio of the transistor M1 does not need to be increased (this means that the parasitic capacitor is not increased, either). From the above disclosure, it can be seen that the present invention can achieve the purpose of increasing the biasing current without increasing the parasitic capacitor. Therefore, the present invention 400 can no doubt work in a higher frequency.

Please note that, in this embodiment, because the drain of the transistor M2 is coupled to the external voltage source, when the control clock CK corresponds to a low logic level (when the latching unit 420 is working), only the biasing current I4 is transferred to the latching unit 420 to use.

Please note that, the present invention does not limit the W/L ratios of the transistors M1~M4 and the currents provided by the biasing current sources 431 and 432. The circuit designer can adjust the W/L ratios of the transistors M1~M4 and the currents provided by the biasing current sources 431 and 432 according to his demands to allow the entire latch 400 to work more efficiently. For example, when the latch 400 works in a lower frequency, it means that the latching unit 420 needs to latch the signal for a longer time. Obviously, the latching unit 420 needs a larger current. Therefore, the circuit designer can correspondingly design the current I4 as a larger current.

From the above disclosure, the operations and functions of the latch 400 can be understood by those skilled in the art. In addition, those skilled in the art can easily utilize the latch 400 in a D-type flip-flop, a frequency divider, or a PLL. As mentioned previously, the D-type flip-flop can be implemented by connecting two latches 400. Furthermore, the frequency divider having the devisor 2 can be implemented by connecting the output Q' to the input end D. Moreover, a frequency divider having a larger divisor can be implemented by connecting several frequency dividers.

Figure 4:
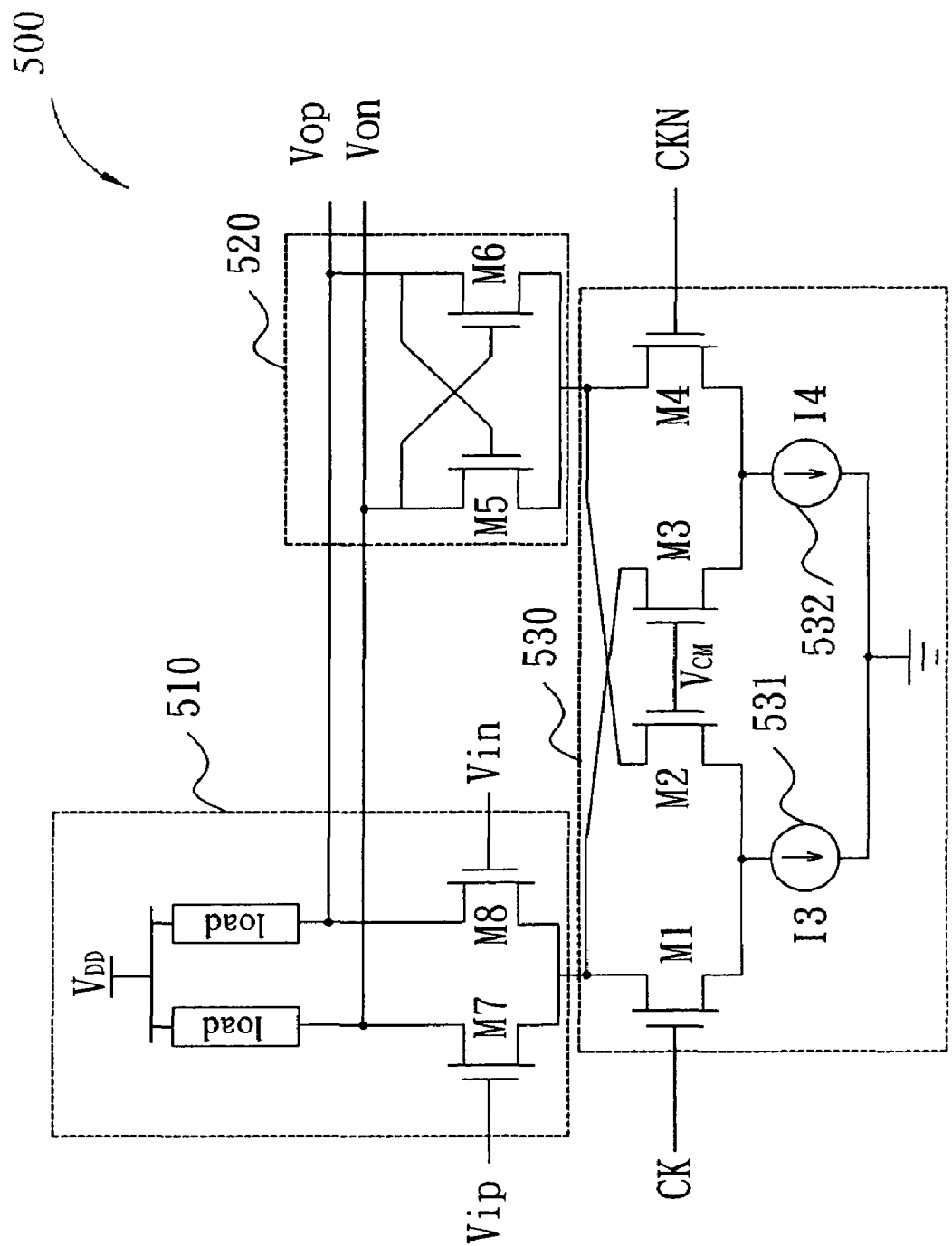
FIG. 4 is a diagram of a latch of a first embodiment according to the present invention.

Please refer to FIG. 4, which is a diagram of a latch 500 of a first embodiment according to the present invention. As shown in FIG. 4, in this embodiment, the latch 500 is similar to the above-mentioned latch 400. The difference between them is: in the biasing circuit 530, the drain of the transistor M2 is coupled to the latching unit 520 instead of the external voltage source $V_{DD}$.

Therefore, in this embodiment, when the inversed control clock CKN corresponds to a high logic level (the control clock CK corresponds to a low logic level), for the differential circuit composed of two transistors M1 and M2, almost all of the current I3 provided by the biasing current source 531 is transferred to the latching unit 520 via the transistor M2 because the common mode voltage level $V_{CM}$ is much higher than the control clock CK.

On the other hand, for the differential circuit composed of two transistors M3 and M4, almost all of the current I4 provided by the biasing current source 532 is transferred to the latching unit 520 via the transistor M4 because the inversed control clock CKN is much higher than the common mode voltage level $V_{CM}$.

Therefore, the latching unit 520 starts to work to latch the signals and then output the latched signals.

From the above, it can be seen that when the latching unit 520 works, the current passing through the transistor M2 is transferred to the latching unit 520. In other words, in this embodiment, the total biasing current inputted to the preamplifier 510 and the latching unit 520 is equal to the sum of the currents I3 and I4.

Similarly, the present invention does not limit the W/L ratios of the transistors M1~M4 and the currents provided by the biasing current sources 531 and 532. The circuit designer can adjust the W/L ratios of the transistors M1~M4 and the currents provided by the biasing current sources 531 and 532 according to his demands (for example, the frequency which the latch 500 work at) to allow the entire latch 400 to work more efficiently.

Figure 5:
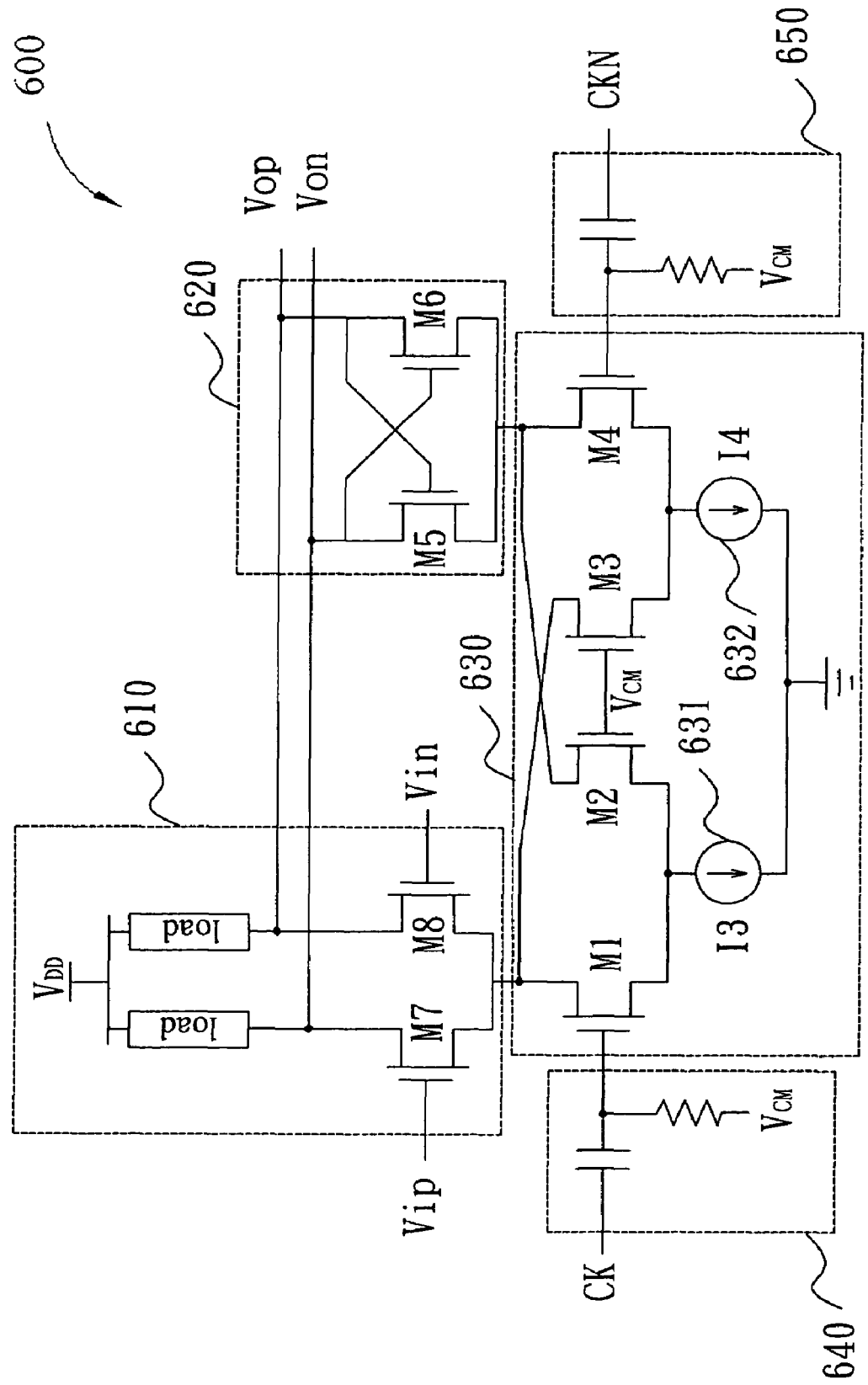
FIG. 5 is a diagram of a latch of a third embodiment according to the present invention.

Please refer to FIG. 5, which is a diagram of a latch 600 of a third embodiment according to the present invention. As shown in FIG. 5, the latch 600 adds two AC couple circuits 640 and 650. The AC couple circuit 640 is coupled between the control clock CK and the preamplifier 610. The AC couple circuit 650 is coupled between the inversed clock CKN and the latching unit 620.

Each of the AC couple circuits 640 and 650 comprises a resistor and a capacitor, which is parallel to the resistor as shown in FIG. 5. In this embodiment, the AC couple circuits 640 and 650 are utilized to make the entire circuit work at a best operational point. The operations and the functions of the AC couple circuits 640 and 650 are well known, and thus omitted here.

Figure 6:
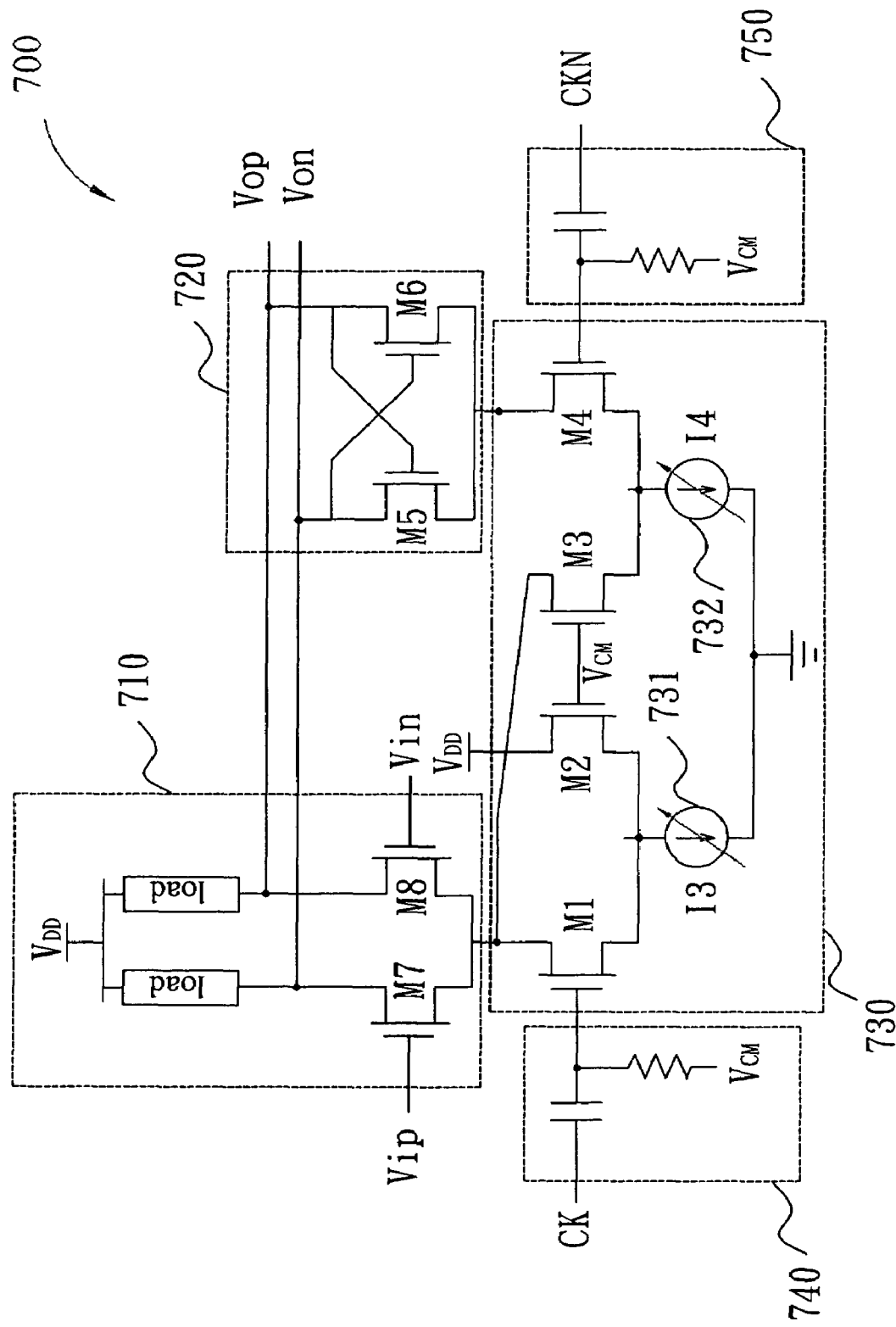
FIG. 6 is a diagram of a latch of a fourth embodiment according to the present invention.

Please refer to FIG. 6, which is a diagram of a latch 700 of a fourth embodiment according to the present invention. As shown in FIG. 6, in the biasing circuit 730, adjustable current sources 731 and 732 are utilized instead of the above-mentioned fixed current sources. In this way, the circuit designer can easily change the currents provided by the adjustable current sources 731 and 732 such that the latch 700 can have better performance when it works at different frequencies.

In contrast to the prior art, the present invention does not need to adjust the W/L ratio of the inner transistors or to increase $V_{GS}$ of the inner transistors in order to increase the biasing current. Therefore, the present invention latch can prevent from the parasitic capacitor problem and can be operated in a high frequency.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A latch comprising:
    an amplifying circuit, for receiving a first biasing current in a first state to amplify an input signal to generate an amplified signal;
    a latching unit, coupled to the amplifying circuit, for latching the amplified signal and for receiving a second biasing current in a second state to output the amplified signal; and
    a biasing circuit, coupled to the amplifying circuit and the latching unit, for providing the first biasing current to the amplified circuit in the first state and for providing the second biasing current to the latching unit in the second state, the biasing circuit comprising:
        a first biasing module, coupled to the amplifying circuit, for providing a third biasing current to the amplifying circuit in the first state; and
        a second biasing module, coupled to the amplifying circuit and the latching unit, for providing a fourth biasing current to the amplifying circuit in the first state and providing the fourth as the second biasing current to the latching unit in the second state;
    wherein the first biasing current is equal to a sum of the third biasing current and the fourth biasing current;
    wherein the first biasing module comprises:
    a first biasing current source, for providing the third biasing current:
    a first transistor, having a control end, a first end, and a second end, the control end coupled to a first clock, the first end coupled to the amplifying circuit, and the second end coupled to the first current source; and
    a second transistor, having a control end, a first end, and a second end, the control end coupled to a common voltage level, and the second end coupled to the first current source:
    and the second biasing module comprises:
    a second biasing current source, for providing the fourth biasing current;
    a third transistor, having a control end, a first end, and a second end, the control end coupled to the common mode voltage level, the first end coupled to the amplifying circuit, and the second end coupled to a second current source; and
    a fourth transistor, having a control end, a first end, and a second end, the control end coupled to a second clock, and the first end coupled to the latching unit, and the second end coupled to the second current source.

2. The latch of claim 1, wherein the first clock is an inversed signal of the second clock.

3. The latch of claim 1, wherein the first biasing current source is an adjustable current source.

4. The latch of claim 1, wherein the second biasing current source is an adjustable current source.

5. The latch of claim 1, further comprising:
an AC couple circuit, coupled to the biasing circuit, for determining an operational point of the latch.

6. The latch of claim 5, wherein the AC couple circuit comprises:
a resistor, coupled to the biasing circuit; and
a capacitor, coupled between the biasing circuit and a common mode voltage level.

7. A latch comprising:
an input circuit, for receiving an input signal and generating an output signal according to the input signal and an input reference current;
an output circuit, coupled to the input circuit, for receiving the output signal and outputting the output signal according to an output reference current; and
a current generating circuit, coupled to the input circuit and the output circuit, for generating the input reference current to the input circuit according to a first logic level of a clock signal, and for generating the output reference current to the output circuit according to a second logic level of the clock signal, the current generating circuit comprising:
a first current generating unit, for providing a first current to the input circuit when the clock signal corresponds to the first logic level, wherein the first current is a part of the input reference current; and
a second current generating unit, for providing a second current to the input circuit when the clock signal corresponds to the first logic level, and for providing the second current to the output circuit when the clock signal corresponds to the second logic level, wherein the second current is a part of the input reference current, and the second current is equal to the output reference current or is a part of the output reference current;
wherein the first current generating unit comprises:
a first transistor pair, coupled to the input circuit, respectively for receiving the clock signal and a reference signal; and
a first current source, coupled to the first transistor pair, for providing the first current;
wherein the first transistor establishes a first conducting path when the clock signal corresponds to the first logic level; and the first current source provides the first current to the input circuit via the first conducting path.

8. The latch of claim 7, wherein the input circuit comprises:
a transistor pair, for receiving the input signal; and
a plurality of loading units, coupled to the transistor pair, for determining the output signal according to the input reference current;
wherein the input signal is a differential signal.

9. The latch of claim 7, wherein the output circuit comprises:
a cross-coupled transistor pair, coupled to the input circuit and the second current generating unit, for receiving the input signal, latching the output signal, outputting the output signal according to the output reference current when the clock signal corresponds to the second logic level.

10. The latch of claim 7, wherein an amplitude of the reference signal is lower than the first logic level, and higher than the second logic level.

11. The latch of claim 7, wherein the first current generating unit provides the first current to the output circuit when the clock signal corresponds to the second logic level, and the first current is a part of the output reference current.

12. The latch of claim 11, wherein the first transistor establishes a second conducting path when the clock signal corresponds to the second logic level, the first current source provides the first current to the output circuit via the second conducting path.

13. The latch of claim 12, wherein an amplitude of the reference signal is lower than the first logic level, and higher than the second logic level.

14. The latch of claim 7, wherein the second current generating unit comprises:
a second transistor pair, coupled to the input circuit and the output circuit, respectively for receiving an inversed signal of the clock signal and a reference signal; and
a second current source, coupled to the second transistor pair, for providing the second current;
wherein the second transistor establishes a third conducting path when the clock signal corresponds to the first logic level, the second current source provides the second current to the input circuit via the third conducting path, and the second transistor establishes a fourth conducting path when the clock signal corresponds to the second logic level, the second current source provides the second current to the output circuit via the fourth conducting path.

15. The latch of claim 14, wherein an amplitude of reference signal is lower than the first logic level, and higher than the second logic level.

16. The latch of claim 7, wherein at least one of the first current generating unit and the second current generating unit comprises an adjustable current source.

17. The latch of claim 7, wherein the first current is different from the second current.

18. The latch of claim 7, further comprising:
an AC couple circuit, coupled to the current generating circuit;
wherein the clock signal is inputted into the current generating circuit through the AC couple circuit.

19. A latch comprising:
an amplifying circuit, for receiving a first biasing current in a first state to amplify an input signal to generate an amplified signal;
a latching unit, coupled to the amplifying circuit, for latching the amplified signal and for receiving a second biasing current in a second state to output the amplified signal; and
a biasing circuit, coupled to the amplifying circuit and the latching unit, for providing the first biasing current to the amplified circuit in the first state and for providing the second biasing current to the latching unit in the second state, the biasing circuit comprising:
a first biasing module, coupled to the amplifying circuit, for providing a third biasing current to the amplifying circuit in the first state; and
a second biasing module, coupled to the amplifying circuit, for providing a fourth biasing current to the amplifying circuit;
wherein the first biasing current is equal to a sum of the third biasing current and the fourth biasing current; and
wherein the first biasing module and the second biasing module are both coupled to the latching unit, for respectively providing a fifth biasing current and a sixth current to the latching unit; and the second biasing current is equal to a sum of the fifth biasing current and the sixth biasing current.

20. The latch of claim 19, wherein the first biasing module comprises:
   a first biasing current source, for providing the third biasing current;
   a first transistor, having a control end, a first end, and a second end, the control end coupled to a first clock, the first end coupled to the amplifying circuit, and the second end coupled to the first current source; and
   a second transistor, having a control end, a first end, and a second end, the control end coupled to a common mode voltage level, the first end coupled to the latching unit, and the second end coupled to the first current source; and the second biasing module comprises:
   a second biasing current source, for providing the fourth biasing current;
   a third transistor, having a control end, a first end, and a second end, the control end coupled to the common mode voltage level, the first end coupled to the amplifying circuit, and the second end coupled to a second current source; and
   a second transistor, having a control end, a first end, and a second end, the control end coupled to a second clock, and the first end coupled to the latching unit, and the second end coupled to the second current source.

21. The latch of claim 20, wherein at least one of the first biasing current source and the second biasing current source is an adjustable current source.

22. The latch of claim 19, further comprising:
   an AC couple circuit, coupled to the biasing circuit, for determining an operational point of the latch.

23. The latch of claim 22, wherein the AC couple circuit comprises:
   a resistor, coupled to the biasing circuit; and
   a capacitor, coupled between the biasing circuit and a common mode voltage level.

* * * * *